United States Patent [19]
Gilliam et al.

[11] Patent Number: 5,627,785
[45] Date of Patent: May 6, 1997

[54] MEMORY DEVICE WITH A SENSE AMPLIFIER

[75] Inventors: Gary R. Gilliam; Steve G. Renfro; Kacey Cutler; Roland Ochoa; Craig E. Schneider, all of Boise, Id.

[73] Assignee: Micron Technology, Inc., Boise, Id.

[21] Appl. No.: 619,808

[22] Filed: Mar. 15, 1996

[51] Int. Cl.$^6$ .................................... G11C 7/00
[52] U.S. Cl. ............... 365/189.01; 365/190; 365/226
[58] Field of Search ................ 365/189.01, 190, 365/205, 207, 208, 226; 327/51, 52

[56] References Cited

U.S. PATENT DOCUMENTS

| | | | |
|---|---|---|---|
| 5,220,221 | 6/1993 | Casper | 307/530 |
| 5,305,263 | 4/1994 | Morgan | 365/190 |
| 5,305,275 | 4/1994 | Yamashita et al. | 365/226 |
| 5,373,227 | 12/1994 | Keeth | 323/313 |
| 5,418,747 | 5/1995 | Tobita | 365/226 |
| 5,420,823 | 5/1995 | Yonaga et al. | 365/226 |

*Primary Examiner*—Tan T. Nguyen
*Attorney, Agent, or Firm*—Schwegman, Lundberg, Woessner & Kluth, P.A.

[57] ABSTRACT

A circuit for a sense amplifier (14) for use with a memory device (10). The circuit includes two devices (40 and 42) that are controlled by a selector (44). The first device (40) drives the sense amplifier (14) with a first current level. The second device (42) drives the sense amplifier (14) with a second current level, different from the first current level. The selector (44) is coupled to the first and second devices (40 and 42) so as to selectively couple one of the first and second devices (40 and 42) to the sense amplifier (14) based on a power supply voltage of the memory device (10).

19 Claims, 2 Drawing Sheets

MEMORY DEVICE WITH A SENSE AMPLIFIER

TECHNICAL FIELD OF THE INVENTION

The present invention relates generally to electronic circuits and in particular to a memory device with a sense amplifier.

BACKGROUND OF THE INVENTION

In the electronics industry, device manufacturers design and produce commodity parts that are capable of operating in a variety of electronic systems that have different electronic specifications. For example, dynamic random access memory (DRAM) devices are designed for use in electronic systems with a wide range of power supply voltage. To keep pace with changes in system specifications, device manufacturers face the difficult task of designing new parts that operate over a wider range of conditions.

A DRAM device is comprised of an array of individual memory cells. Typically, each memory cell comprises a capacitor capable of holding a charge and an access transistor for accessing the capacitor charge. The charge is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output lines through transistors used as switching devices. For each bit of data stored, its true logic state is available on an I/O line and its complementary logic state is available on an I/O complement line. Thus, each memory cell has two digit lines, digit and digit complement.

Typically, the memory cells are arranged in an array and each cell has an address identifying its location in the array. The array comprises a configuration of intersecting rows and a memory cell is associated with each intersection. In order to read from or write to a cell, the particular cell in question must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

Conventional dynamic memory devices use memory cells fabricated as capacitors in an integrated circuit to store data. That is, a logical "1" is stored as a charge on the capacitor and the capacitor is discharged for a logical "0". The pairs of digit lines are fabricated as metal lines on the integrated circuit and connected to the memory cells for transmitting data stored in the memory cells. Sense amplifiers are utilized to sense small differentials on the digit lines and drive the digit lines to full power supply rails for either reading the memory cells or writing thereto.

Typically, a sense amplifier includes a pair of n-channel transistors having a cross-coupled gate and drain configuration. Due to the positive feedback of this configuration, the sense amplifier senses slight changes in the voltages on the digit and digit complement lines and produces full logic values on the digit lines based on the slight voltage differential. The source of each transistor is coupled to a pull down device, which, in operation drives the source of the transistors to ground thus allowing the sense amplifier to amplify the small changes in voltage on the digit and digit complement lines.

Conventionally, the pull doom device of an n-channel sense amplifier comprises an n-channel MOS transistor. Unfortunately, conventional pull down devices do not function properly over the wider range of power supply voltages demanded by newer systems. At low supply voltages, the current in a typical pull down device is not sufficient to allow the sense amplifier to settle quick enough to produce an accurate reading at the digit lines. Further, at high power supply voltages, the pull down device draws too much current and drives the common source and the drains of both transistors to ground before the digit lines can reach the proper voltages.

For the reasons stated above, and for other reasons stated below which will become apparent to those skilled in the art upon reading and understanding the present specification, there is a need in the art for a memory device which functions properly over a wide range of power supply voltage.

SUMMARY OF THE INVENTION

A memory device with a sense amplifier is described which operates acceptably over a wide range of power supply voltages. In one embodiment, the present invention describes a circuit for a sense amplifier for use with a memory device that is operable over varied power supply voltages. The circuit includes two devices that are controlled by a selector. The first device drives the sense amplifier with a first current level. The second device drives the sense amplifier with a second current level, different from the first current level. The selector is coupled to the first and second devices so as to selectively couple devices to the sense amplifier based on a power supply voltage of the memory device.

In one embodiment the devices are n-channel MOS transistors that function as pull-down devices for an n-sense amplifier. The pull-down devices may have different widths so as to drive the sense amplifier with different current levels. Alternatively, the pull-down devices may have similar widths and be selectively coupled alone or in combination to the sense amplifier to produce an acceptable current to drive the sense amplifier.

In further embodiments, the selector comprises a Schmitt trigger that produces a signal that selectively activates the devices based on the power supply voltage. The Schmitt trigger receives a signal that is proportional to the supply voltage and compares the signal with a threshold value of the Schmitt trigger. In further embodiments, the selector circuit comprises logic gates coupled between the Schmitt trigger and the first and second devices so as to produce signals to selectively activate the devices.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense.

Figure 1:
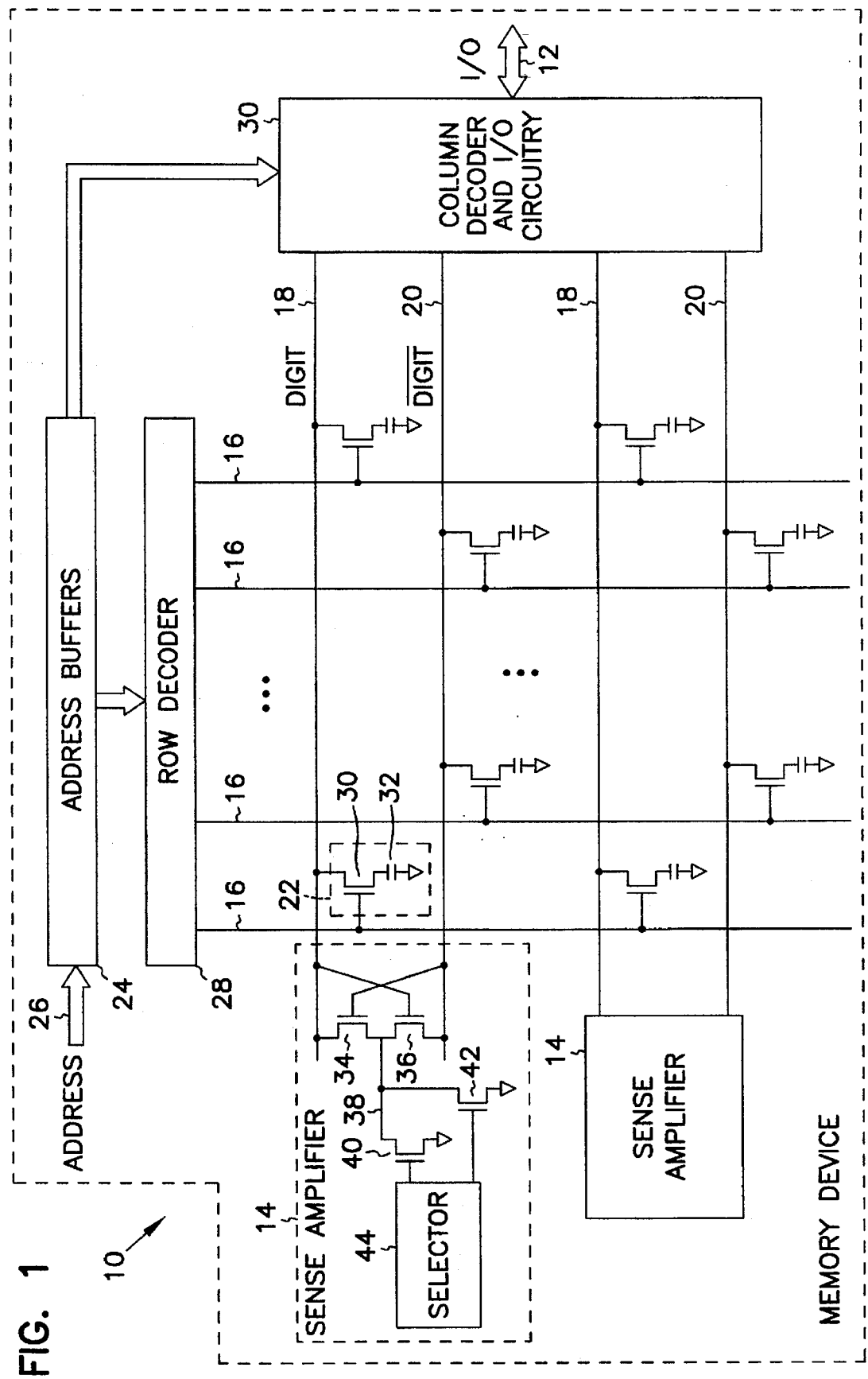
FIG. 1 is a schematic diagram of an illustrative embodiment of the present invention.

FIG. 1 is a schematic diagram of a memory device, indicated generally at 10. Device 10 uses dual or folded digit lines to transfer data to and from memory cells via input/output (I/O) port 12. Device 10 includes row lines 16, digit lines 18, and digit complement lines 20. A memory cell 22 is coupled to each row 16 at the intersection with either a digit line 18 or a digit complement line 20. Sense amplifiers 14 are coupled to a corresponding pair of digit line 18 and digit complement line 20. The operation of device 10 is not tied to the folded digit line configuration shown in FIG. 1. Device 10 may, alternatively, use an open digit line or other appropriate configuration for the array of memory cells that can be accessed through sense amplifiers 14.

Device 10 further includes circuitry that selects a memory cell 22 from device 10 to receive input or provide output to an external device such as a microprocessor (not shown) at I/O port 12. Address buffers 224 receive an address at input port 26 from the external device. Address buffers 24 are coupled to row decoder 28 and column decoder 30. Column decoder 30 includes input-output circuitry that is coupled to the external device at I/O port 12. Row decoder 28 is coupled to rows 16. Column decoder 30 is coupled to digit lines 18 and digit complement lines 20.

Each sense amplifier 14 includes first and second n-channel MOS transistors 34 and 36 in a cross coupled configuration so as to form a basic flip-flop. A source of transistor 34 is coupled to a source of transistor 36 at node 38. A gate of transistor 34 is coupled to digit complement line 20 and a gate of transistor 36 is coupled to digit line 18. A drain of transistor 34 is coupled to digit line 18. A drain of transistor 36 is coupled to digit complement line 20. First and second pull down devices 40 and 42 are coupled to node 38 so as to drive sense amplifier 14. First and second pull-down devices 40 and 42 comprise n-channel MOS transistors each having a drain coupled to node 38 and a source coupled to ground. Selector circuit 44 is coupled to a gate of each of pull-down devices 40 and 42 so as to selectively activate either pull-down device 40 or pull-down device 42. Advantageously, pull-down devices 40 and 42 have different widths so as to provide acceptable pull-down capabilities for sense amplifier 14 at different power supply voltages.

In operation, device 10 receives an address of a selected cell at address buffers 24. Address buffers 24 identify a row 16 of a selected cell 22 to row decoder 28. Row decoder 28 provides a voltage on line 16 to activate access transistors 30 of each cell 22 in the selected row 16. The charge on the capacitor 32 is coupled to one of the digit lines 18 or digit complement lines 20. Sense amplifier 14 senses a slight difference between the voltage on digit line 18 and the voltage on digit complement line 20 of the selected cell 22 and drives digit line 18 and digit complement line 20 to the value of the power supply rails.

Sense amplifier 14 assures proper operation over a wide range of power supply voltages by selectively coupling either first or second pull-down devices 40 and 42 to node 38. At a high power supply voltage, selector 44 couples pull-down device 42 to node 38 when data is ready to be written to or read from cell 22. Pull-down device 42 is fabricated with a width that is less than the width of pull-down device 40 such that pull-down device 42 draws a sufficiently low current that allows transistors 34 and 36 sufficient time to determine the content of the selected cell 22.

At low power supply voltage, selector 44 couples pull-down device 40 to node 38 when data is ready to be written to or read from cell 22. Pull-down device 40 is fabricated with a width that is, for example, approximately twice as big as pull-down device 42. Thus, pull-down device 40 draws a sufficiently high current so as to assure that transistors 34 and 36 operate fast enough to accurately write data to or read data from a selected cell 22. Therefore, by using two pull-down devices, a manufacturer can produce memory devices that function properly over a wider range of power supply voltage.

Figure 2:
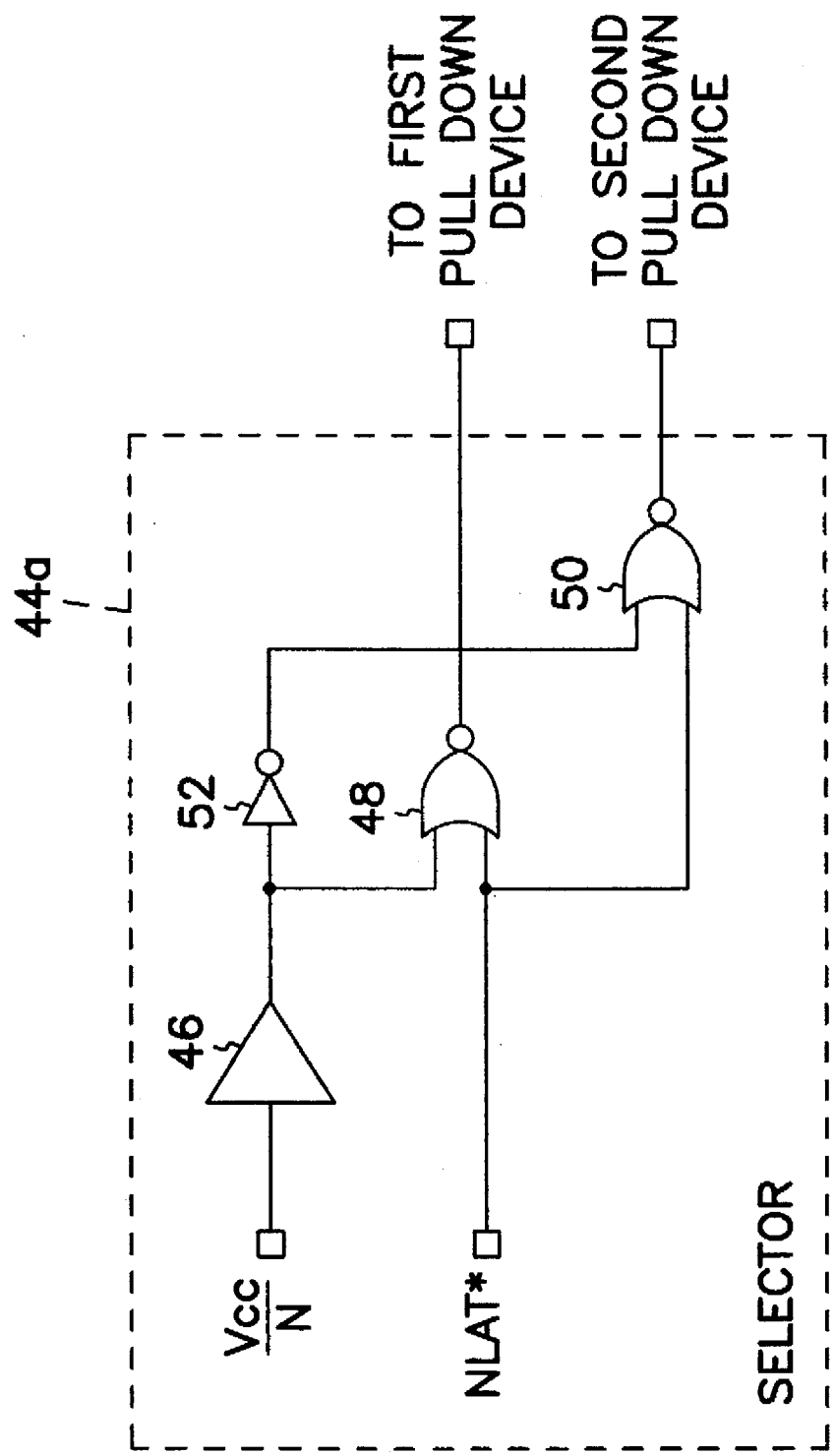
FIG. 2 is a schematic diagram of an embodiment of a selector logic circuit for use with the embodiment of FIG. 1.

FIG. 2 is a block diagram of an illustrative embodiment of a selector, indicated generally at 44a. Selector 44a selects between first and second pull down devices 40 and 42 of sense amplifier 14 based on the power supply voltage. Selector 44a comprises a Schmitt trigger 46 that receives a voltage that is proportional to the power supply voltage; labelled as $V_{cc}/N$. This voltage may be supplied by either an existing node of a memory device or generated with circuitry as known to a person of ordinary skill in the art. In some memory devices, a node exists that is established at one-half of the power supply. This node may be advantageously used as an input to the Schmitt trigger. Selector 44a further includes first and second NOR-gates 48 and 50 and inverter 52. The output of schmitt trigger 46 is coupled to a first input of NOR-gate 48 and m input of inverter 52. The output of inverter 52 is coupled to a first input of NOR-gate 50. Finally, a latch signal, NLAT*, is coupled to a second input of both NOR-gate 48 and NOR-gate 50.

In operation, selector 44a selects first pull-down device 40 when the power supply voltage is low and selects second pull-down device 42 when the power supply voltage is high. Schmitt trigger 46 receives a signal that is proportional to the power supply voltage. The threshold of Schmitt trigger 44a and its input are selected such that for high power supply voltages, Schmitt-trigger 46 outputs a high logic value and for low power supply voltages, Schmitt trigger 46 outputs a low logic value.

When the input to Schmitt trigger 46 exceeds a threshold value, Schmitt trigger 46 outputs a high logic value to inverter 52 which produces a low logic value. In response, NOR-gate 50 produces a high logic output when the latch signal goes low which turns on second pull-down device 42. Thus, selector 44a selects second pull-down device 42 when the power supply voltage is high.

When the input to Schmitt trigger 46 does not exceed the threshold value, schmitt trigger 46 outputs a low logic value. In response, NOR-gate 48 produces a high logic output when the latch signal goes low which turns on first pull down device 40. Thus, selector 44a selects first pull-down device 40 when the power supply voltage is low. Due to the differing widths of first and second pull down devices 40 and 42, selector 44a allows sense amplifier 14 to function properly over a wide range of power supply voltage by activating a pull down device that will draw an appropriate current from sense amplifier 14.

Conclusion

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the sense amplifier is not limited to use with a folded digit line configuration. For example, open digit line or other conventional configurations may be used. Further, selector 44 can be modified with different logic circuitry so long as the circuitry allows selector 44 to select between the pull-down devices based on the power supply voltage.

The arrangement of pull down devices. 40 and 42 can be varied without departing from the spirit and scope of the invention. For example, devices 40 and 42 can be fabricated in various proportions so long as the devices provide acceptable current levels over the specified power supply voltage range. For example, first and second pull-down devices 40 and 42 can be replaced by two transistor with similar widths. In this case, selector 44 coupled one of the transistors to drive the sense amplifier when the power supply provides a high voltage. When the power supply voltage is low, the selector couples both of the transistors to drive the sense amplifier.

Sense amplifier 14 of FIG. 1 is shown as an n-sense amplifier. As is known in the art, sense amplifier 14 can also include a p-sense amplifier such that the n-sense and p-sense amplifiers are fired in turn to read from or write to a memory cell. The n-sense amplifier drives a digit line 18 or digit complement line 20 to a the low power supply rail and the p-sense amplifier drives the other of digit line 18 and digit complement line 20 to the value of the high power supply rail. In conventional operation, either the p-sense amplifier or the n-sense amplifier is fired first. A further embodiment of the present invention includes a p-sense amplifier first and second pull-up devices that are selectively coupled to drive the p-sense amplifier based on the power supply voltage. Thus, the p-sense amplifier can be fired before the n-sense amplifier and the sense amplifier will operate acceptably over a wide range of power supply voltages.

What is claimed is:

1. A circuit for a sense amplifier for use with a memory device operable under varied power supply voltages, the circuit comprising:

a first device that is operable to drive the sense amplifier with a first current level;

a second device that is operable to drive the sense amplifier with a second current level, different from the first current level; and a selector coupled to the first and second devices for selectively coupling the first and second devices to the sense amplifier based on the power supply voltage of the memory device.

2. The circuit of claim 1, wherein the first and second devices comprise n-channel MOS transistors that have different widths, a gate of each transistor coupled to receive a control signal from the selector.

3. The circuit of claim 2, wherein the first device is approximately twice as wide as the second device.

4. The circuit of claim 1, wherein the selector logic circuit comprises a Schmitt trigger that produces a signal that selectively activates the first and second devices so as to produce an acceptable drive current level for the sense amplifier.

5. The circuit of claim 4, wherein the Schmitt trigger receives a selection signal that is proportional to the supply voltage and compares the selection signal with a threshold value of the Schmitt trigger.

6. The circuit of claim 5, wherein the selector logic circuit further comprises:

a first logic gate coupled between the Schmitt trigger and the first device so as to drive the sense amplifier when the selection signal is below the threshold value; and a second logic gate coupled between the Schmitt trigger and the second device so as to drive the sense amplifier when the selection signal is above the threshold value.

7. The circuit of claim 6, wherein:

said first logic gate comprises a NOR-gate having a first input coupled to an output of the Schmitt trigger and a second input coupled to a latch signal for the sense amplifier; and said second logic gate comprises a NOR-gate having a first input coupled to an inverted output of the Schmitt trigger and a second input coupled to the latch signal for the sense amplifier.

8. The circuit of claim 1, wherein the first and second devices comprise first and second pull-down devices in an n-sense amplifier.

9. A memory device, comprising:

a plurality of storage cells each coupled to a row line and a column line;

row addressing circuitry coupled to the row lines for selecting a row for a storage cell;

column addressing circuitry coupled to the column lines for selecting a column for the selected storage cell; and a sense amplifier coupled to a column line that detects the voltage stored in the selected storage cell, the sense amplifier including a circuit comprising:

a first device that is operable to drive the sense amplifier with a first current level;

a second device that is operable; to drive the sense amplifier with a second current level, different from the first current level; and a selector coupled to the first and second devices for selectively coupling one of the first and second devices to the sense amplifier based on a power supply voltage of the memory device.

10. The memory device of claim 9, wherein the first and second devices comprise n-channel MOS transistors that have different widths, a gate of each transistor coupled to receive a control signal from the selector.

11. The memory device of claim 10, wherein the first device is approximately twice as wide as the second device.

12. The memory device of claim 9, wherein the selector comprises a Schmitt trigger that produces a signal that indicates which of the first and second devices will produce an acceptable drive current level for the sense amplifier.

13. The memory device of claim 12, wherein the Schmitt trigger receives a selection signal that is proportional to the supply voltage and compares the selection signal with a threshold value.

14. The memory device of claim 13, wherein the selector further comprises:

a first logic gate coupled between the Schmitt trigger and the first device so as to drive the sense amplifier when the selection signal is below the threshold value; and a second logic gate coupled between the Schmitt trigger and the second device so as to drive the sense amplifier when the selection signal is above the threshold value.

15. The memory device of claim 14, wherein:

said first logic gate comprises a NOR-gate having a first input coupled to an output of the Schmitt trigger and a second input coupled to a latch signal for the sense amplifier; and said second logic gate comprises a NOR-gate having a first input coupled to an inverted output of the Schmitt trigger and a second input coupled to the latch signal for the sense amplifier.

16. The memory device of claim 14, wherein the first and second devices comprise pull-down devices in an n-sense amplifier.

17. A method for controlling a sense amplifier in a memory device, comprising the steps of:

determining the power supply voltage;

driving the sense amplifier with a first device at a first current level when the power supply voltage is low; and driving the sense amplifier with a second device at a second current level, different from the first current level when the power supply voltage is high.

18. The method of claim 17, wherein the step of determining the power supply voltage comprises the step of determining when the power supply exceeds a threshold.

19. The method of claim 17, wherein the step of driving the sense amplifier with a second device, comprises the step of driving the sense amplifier with the first and second devices at a second current level, different from the first current level.

* * * * *